United States Patent [19]

Inoue et al.

[11] Patent Number: 5,556,814

[45] Date of Patent: Sep. 17, 1996

[54] METHOD OF FORMING WIRINGS FOR INTEGRATED CIRCUITS BY ELECTROPLATING

[75] Inventors: Tomotoshi Inoue, Kawasaki; Misao Yoshimura, Yokohama, both of Japan

[73] Assignee: Kabushiki Kaisha Toshiba, Kawasaki, Japan

[21] Appl. No.: 410,744

[22] Filed: Mar. 27, 1995

[30]   Foreign Application Priority Data

Mar. 28, 1994  [JP]  Japan ................................ 6-056895

[51] Int. Cl.⁶ ................................................ H01L 21/02
[52] U.S. Cl. ........................ 437/230; 437/183; 437/184
[58] Field of Search .................................. 437/230, 183, 437/184, 192

[56]          References Cited

U.S. PATENT DOCUMENTS

| | | | |
|---|---|---|---|
| 5,098,860 | 3/1992 | Chakravorty et al. | 437/230 |
| 5,148,260 | 9/1992 | Inoue et al. | |
| 5,202,291 | 4/1993 | Charvat et al. | 437/245 |
| 5,340,773 | 8/1994 | Yamamoto | 437/230 |
| 5,380,679 | 1/1995 | Kano | 437/230 |

FOREIGN PATENT DOCUMENTS

| | | |
|---|---|---|
| 49-83868 | 8/1974 | Japan . |
| 3-214736 | 9/1991 | Japan . |
| 4-085829 | 3/1992 | Japan . |

*Primary Examiner*—George Fourson
*Assistant Examiner*—Thomas G. Bilodeau
*Attorney, Agent, or Firm*—Oblon, Spivak, McClelland, Maier, & Neustadt, P.C.

[57]          ABSTRACT

A method for forming wirings of an integrated circuit comprises a step of forming wirings on a substrate, a step of coating the wirings with a thin under metal layer, a step of coating the under metal layer with a mask except a part of the under metal layer, a first etching step of removing the under metal layer which is not coated by the mask to expose upper portions of at least ones of the wirings, an electroplating step of depositing a plating metal layer on the exposed upper portions, a step of removing the mask, and a second etching step of removing all of the remaining under metal layer, whereby said plating metal layer is formed by substantially same material as that of the exposed upper portions or by a material which can be closely contacted with the exposed upper portions and whereby said under metal layer is formed by a material which can be preferentially removed from the exposed upper portions.

18 Claims, 5 Drawing Sheets

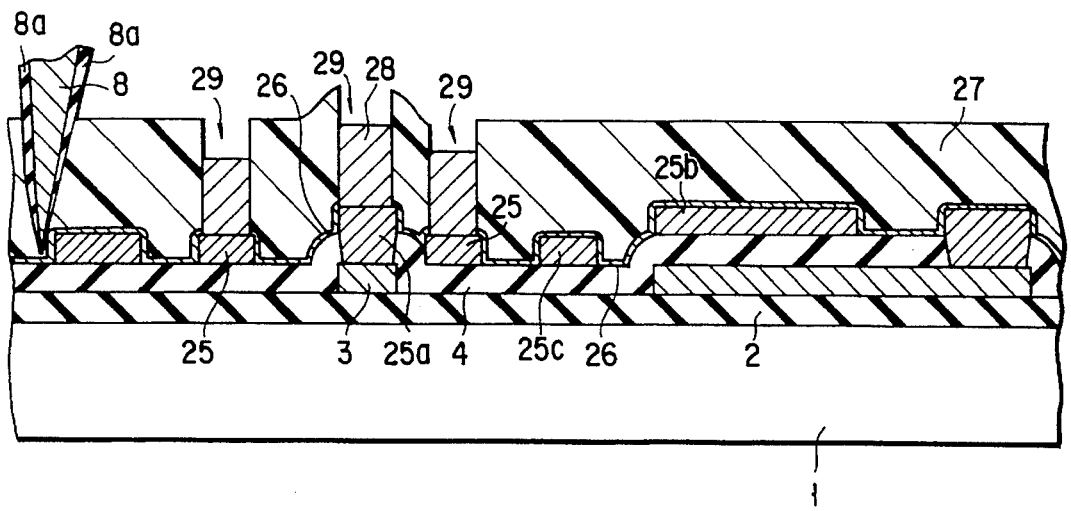
F I G. 9
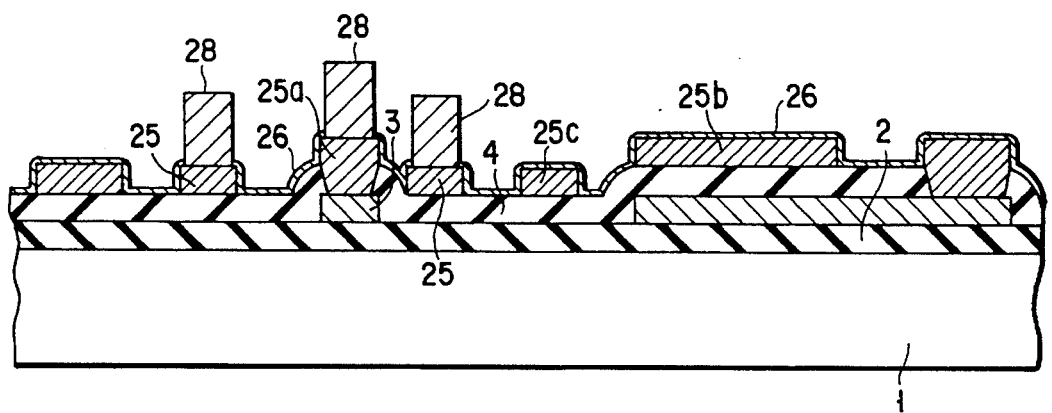
F I G. 10
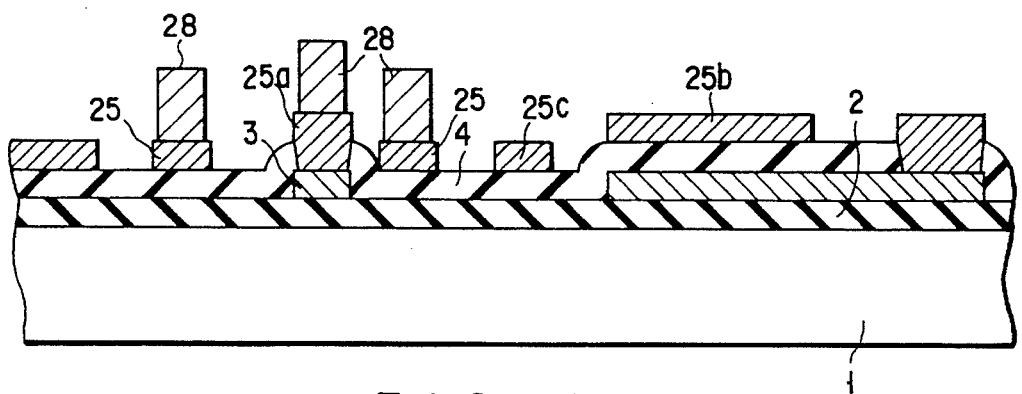
F I G. 11

METHOD OF FORMING WIRINGS FOR INTEGRATED CIRCUITS BY ELECTROPLATING

BACKGROUND OF THE INVENTION

1. Field of the Invention

The present invention relates to a method for forming wirings of integrated circuits and it also relates to an integrated circuit thus formed.

2. Description of the Related Art

As the high frequency circuits are used more and more widely, they are asked to become smaller in size. Particularly in the case of semiconductor devices, an MMIC (monolithic microwave integrated circuit) in which even receiving elements are integrated is proposed.

Same thing can be said about the semiconductor module and receiving elements on a substrate are asked to become smaller in size. One of important things in making them smaller in size is to reduce loss of wirings and electrodes in a circuit.

On the other hand, the common method of making circuit elements smaller in size is to reduce the area of each element. When the circuit elements are made small in size, wiring and electrode resistances become large. Metal (Au) having a small electric resistance value is used for these wirings and electrodes. It is however difficult to make these Au-made wirings and electrodes thick by a single process. Wirings and electrodes are therefore formed thin on a wafer at a first step and metal is then laminated thick on them at a second step by electroplating. Metal having same resistance value as Au is used as plating material in this case. The term "wiring" used herein means not only a thin, wire-like conductor, but also a conductor such as a gate electrode.

Referring to FIGS. 1 through 3, the conventional method of forming wirings will be described. A substrate 1 is made of GaAs and a first insulating layer 2 made of $SiO_2$ is formed on the substrate 1. A first wiring 3 is formed on the first insulating layer 2. A second wiring 5 and a second insulating layer 4 made of $SiO_2$ are further formed on them.

In order to form a third wiring 9 at the electroplating process which will be later carried out, a thin under metal layer (or metal layer through which plating current is supplied) 6 is then formed all over the wafer to thereby also electrically connect all of the wirings 5. The under metal layer 6 serves as a plating metal depositing electrode at the electroplating process. Metal which allows plating metal to be easily deposited on it is therefore used to form the under metal layer 6. Further, metal which is same in kind as the plating metal is usually used to form the under metal layer 6, because it can provide excellent close contact and smooth surface. When metal which is quite different in composition from the plating metal is used to form the under metal layer 6, the plating metal 9 is likely to separate and peel off from the under metal layer 6. Further, Au particles electroplated have a diameter larger than usual ones and the layer plated by them has a rough surface. Wirings or electrodes thus formed have a high resistance.

Conventionally, Au is often used as wirings of the electric circuit and it is also used as the under metal. In order to conduct the plating selectively, a mask 7 is formed, as shown in FIG. 1, on that area of the wafer where no plating is conducted. The mask 7 is an insulating material such as photo resist.

The electroplating is then conducted, as shown in FIG. 1, while using the under metal layer (Au) 6 as a cathode. As shown in FIG. 2, the plated metal layer 9 is formed to have a thickness larger enough than that of the under metal layer 6. The mask 7 is all removed after the electroplating and the under metal layer 6 is also removed as shown in FIG. 3.

However, Au is one of the most difficult metals to remove. Two methods are conventionally used to remove the under metal layer 6 which is made of Au. One of them is to etch all over the under metal layer 6 by ion milling. The other is to etch all over the under metal layer 6 by a composition of the cyanic group. Whichever may be used, matters (wirings 5, 9 and under metal layer 6) exposed on the surface of the wafer are made of Au. A part of them is therefore removed. In short, it is allowed in conventional cases that they are a little etched, as shown in FIG. 3. When the etching condition changes in removing the under metal layer 6, therefore, they are sometimes over-etched. In the worst case, they vanish. Particularly when the wiring has a narrow line width about two times that of the under metal layer 6, it is strongly affected by the over-etching. Further, manufacturing cost is increased when the ion milling method is used because the apparatus needed by the method is high in cost.

On the other hand, cyanogen must be used in plating solution at the electroplating process. Cyanogen which is a poisonous matter becomes a problem for reasons of safety and sanitation when it is disposed as a waste.

SUMMARY OF THE INVENTION

The object of the present invention is therefore to provide a method capable for forming wirings of a semiconductor device circuit at a lower cost and with a higher safety and also capable of reducing their electric resistance to a greater extent. The object of the present invention is also to provide an integrated circuit thus created by the wirings forming method.

According to the present invention, a method of forming wirings and electrodes for an integrated circuit can be provided, comprising forming wirings and electrodes on a substrate; coating all of these wirings and electrodes with a thin under metal layer; coating the under metal layer with a mask except a part of the under metal layer; a first etching step of removing the under metal layer which is not coated with the mask to expose upper portions of at least ones of the wirings; an electroplating step of depositing a plated metal layer on the exposed upper portions; removing the mask and a second etching step of removing the remaining under metal layer; wherein the metal layer deposited is made of metal substantially same as a material of which the exposed upper portions are made, or a material having an excellent close contact with the exposed upper portions; and whereby the under metal layer is made of a material which can be preferentially removed from the exposed upper portions and deposited metal by electroplating.

It is preferable in this case that the under metal layer includes at least one or more metals selected from a group of W, Mo and Al. It is more preferable that the under metal layer is formed by tungsten having a thickness of 50–300 nm. The under metal layer must be formed by metal on which plating metal can develop.

It is also preferable that the metal layer plated or deposited includes at least one or more metals selected from a group of Au, Pt and Pd.

Further, it is desirable that the exposed upper portion includes at least one or more metals deposited not by the plating and selected from the group of Au, Pt and Pd.

Furthermore, it is desirable at the first etching step that the under metal layer is removed by RIE by which $CF_4$ gas is used and it is also desirable at the second etching or $CF_4/O_2$ mixed gas step that it is removed by RIE by which $CF_4$ gas or $CF_4/O_2$ mixed gas is used.

According to the present invention, an integrated circuit can be provided, comprising a substrate, initial wirings formed on the substrate; additional wirings formed on the initial wirings by the electroplating method to connect directly to the initial wirings, and stepped portions each defined by either side of each initial wiring an exposed upper surface of the initial wiring and either of the additional wiring formed on the initial wiring at the directly connected sections.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a vertically-sectioned view showing a wafer electroplated;

FIG. 10 is a vertically-sectioned view showing a wafer electroplated and from which the resist is removed;

FIG. 11 is a vertically-sectioned view showing a wafer from which the plating current supply layer is removed;

DETAILED DESCRIPTION OF THE PREFERRED EMBODIMENT

Some embodiments of the present invention will be described with reference to the accompanying drawings.

Figure 1:
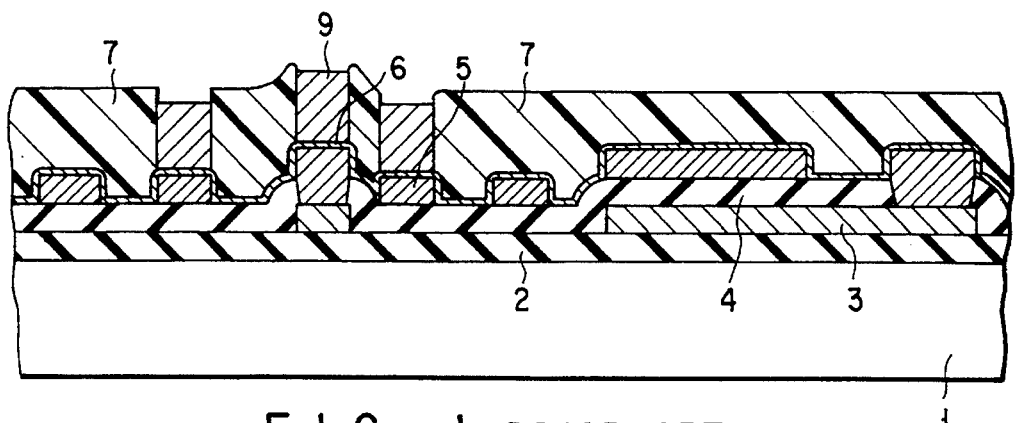
FIG. 1 is a vertically-sectioned view showing a wafer intended to explain the conventional method.
Figure 2:
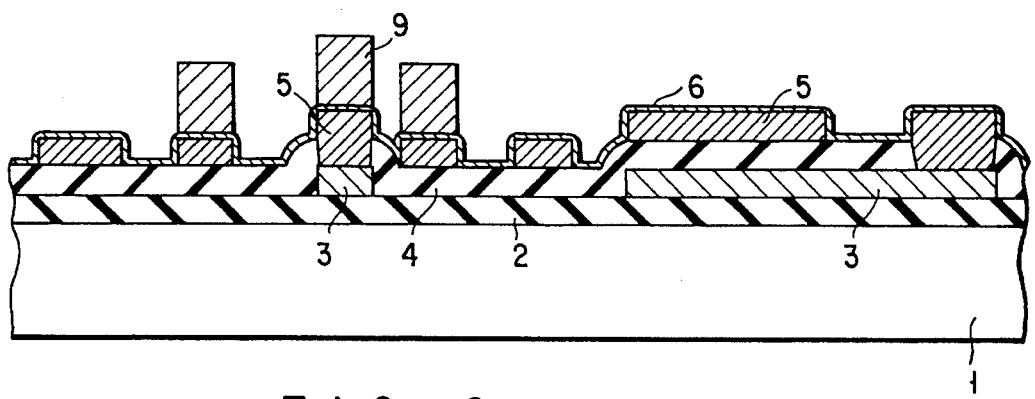
FIG. 2 is a vertically-sectioned view showing a wafer intended to explain the conventional method.
Figure 3:
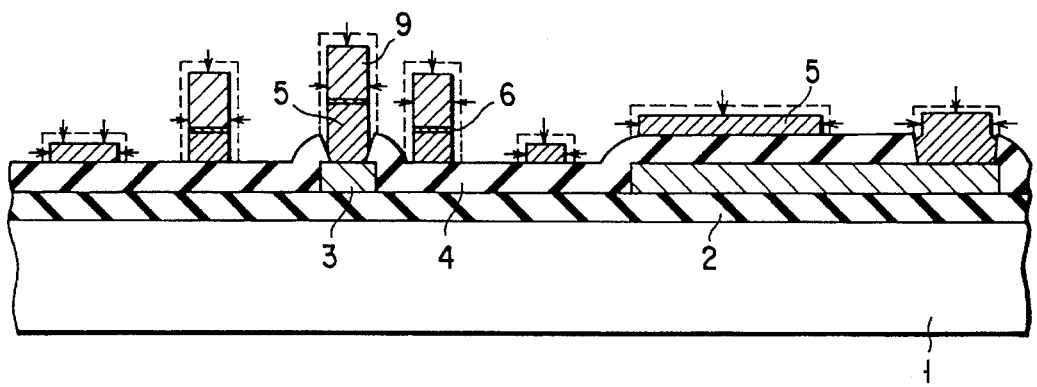
FIG. 3 is a vertically-sectioned view showing a wafer intended to explain the conventional method.
Figure 4:
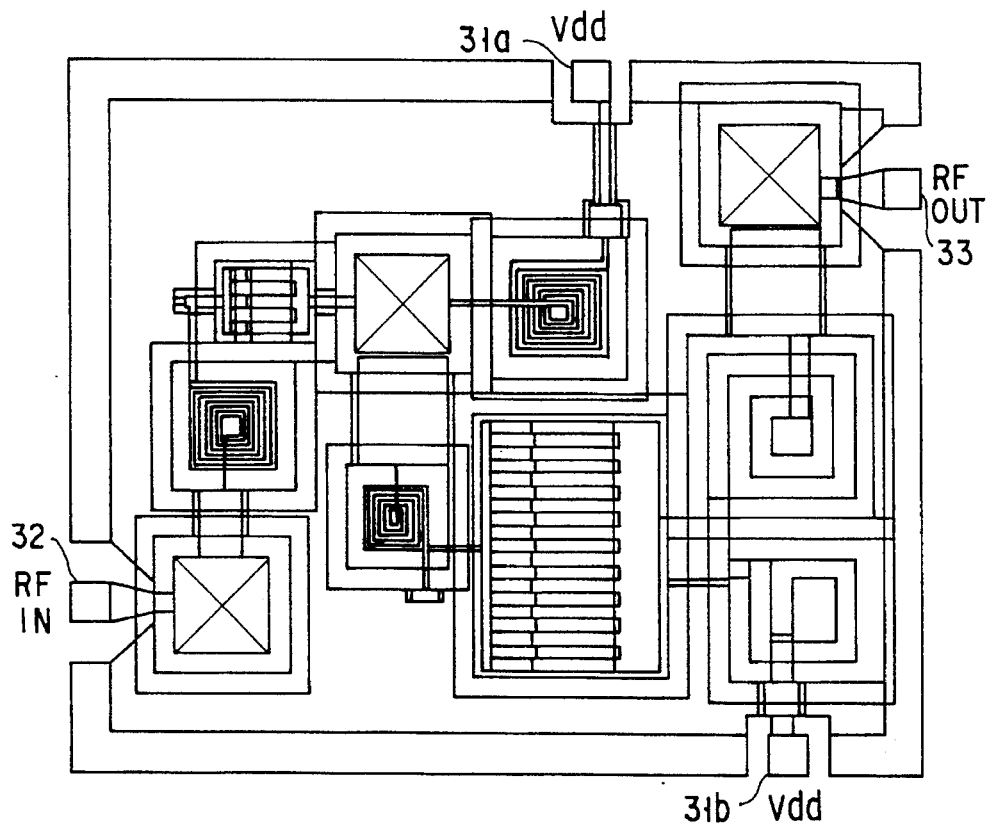
FIG. 4 is a plan view showing a layout of the power amplifier MMIC.

As shown in FIG. 4, a plurality of inductors and capacitors are arranged in the wiring circuit of a power amplifier MMIC (monolithic microwave integrated circuit). DC current flows from a power source (not shown) into the circuit through electrodes 31a and 31b. Radio frequency enters into the circuit through an RF inlet 32 and comes out of the circuit through an RF outlet 33.

Figure 5:
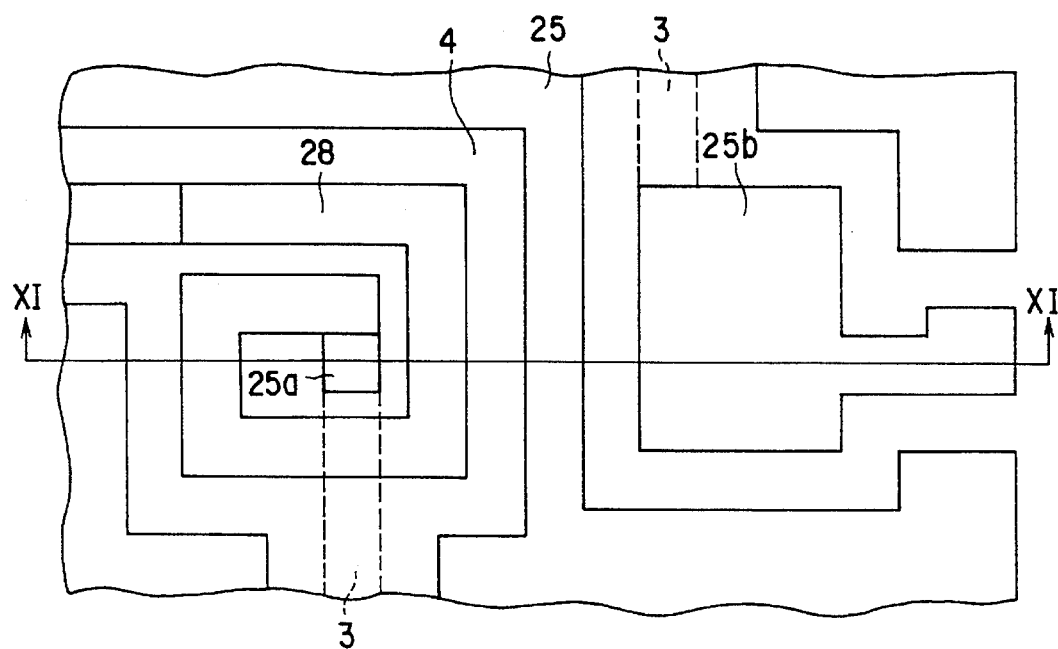
FIG. 5 is a plan view showing a part of the MMIC enlarged.
Figure 6:
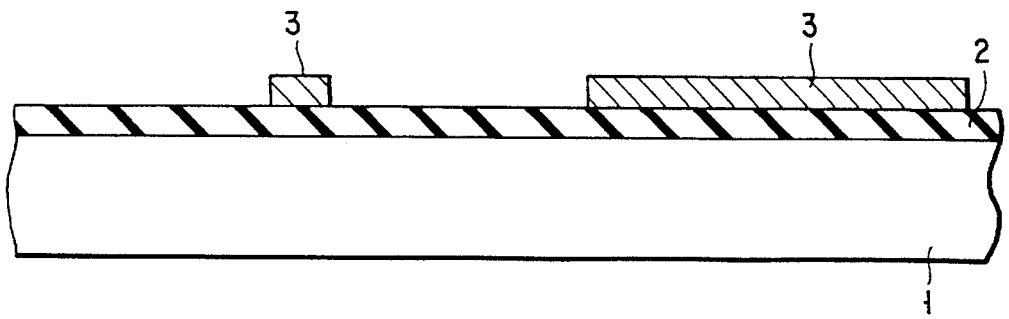
FIG. 6 is a vertically-sectioned view showing a wafer on which wirings are formed.

As shown in FIG. 5, an upper wiring 28 is connected to a lower one 3 through an electrode 25a to form an inductor circuit. The upper wiring 28 is formed by the electroplating. The lower wiring 3 is formed not by the electroplating but by Lift-off method, for example. A capacitor circuit is formed by an upper electrode 25b and the lower wiring 3.

Referring to FIGS. 6 through 11, it will be described how the MMIC wiring circuit is made.

A substrate 1 is a wafer having a predetermined size and made of semi-insulation GaAs (to serve as a semiconductor whose main function is to insulate). A first insulating layer 2 made of $SiO_2$ is formed all over the GaAs substrate 1. A first wiring 3 is formed on the first insulating layer 2. This first wiring 3 is formed not by the plating method but by other one. The method such as the lift-off one and the ion milling etching one whose pattern forming accuracy is quite high is used, for example. The first wiring 3 is 1 to 2 μm thick.

Figure 7:
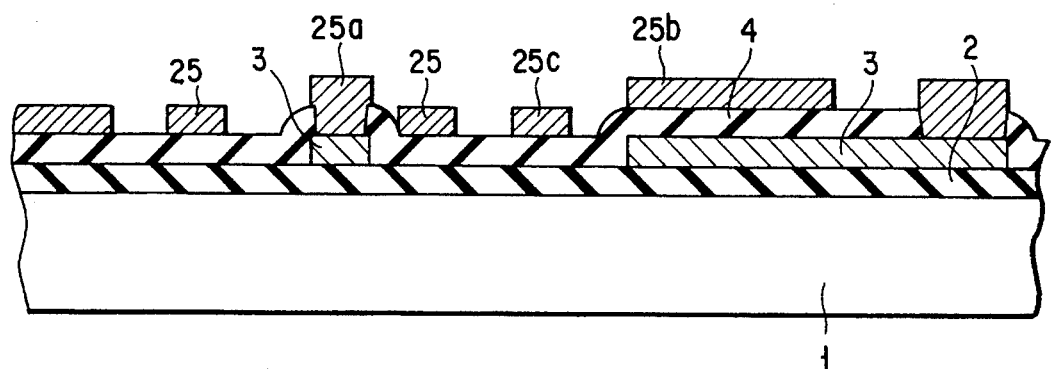
FIG. 7 is a vertically-sectioned view showing a wafer on which wirings are formed.

As shown in FIG. 7, a second insulating layer 4 is formed on the first insulating layer 2 and the first wiring 3. Further, a second wiring 25a is formed on the first wiring 3, while other second wirings 25, 25a, 25b and 25c on the second insulating layer 4. The second wirings 25, 25a, 25b and 25c are formed by the lift-off method.

Each of the second wirings 25, 25a, 25b and 25c has a triple-layer structure comprising Ti/Mo/Au when seen from the bottom. The upper portion of each of the second wirings 25, 25a, 25b and 25c is formed by metal (Au) of same kind as that of metal which will be plated later. Ti/Mo/Au of each of the second wirings 25, 25a, 25b and 25c are 5/50/100 (nm) thick. The line width of the wiring 25 is set at 10 μm, that of the wiring 25a at 10 μm, and that of the wiring 25b at 10 μm.

Figure 8:
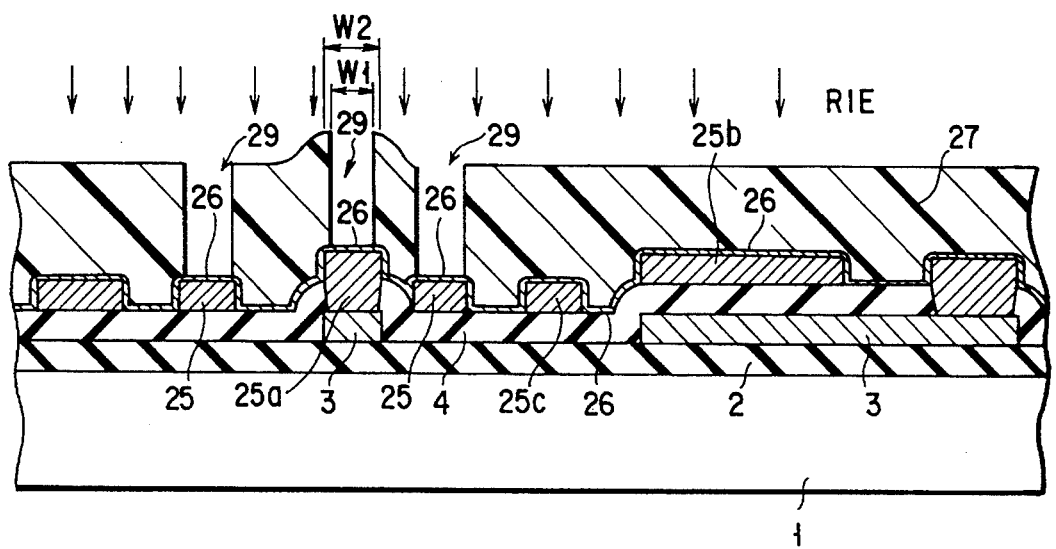
FIG. 8 is a vertically-sectioned view showing a wafer on which plating current supply and resist (or mask) layers are formed.

As shown in FIG. 8, an under metal layer 26 is formed all over the wafer. Metal which can be selectively (or partly) removed from metal which will be plated later is used to form the under metal layer 26. It is desirable that the under metal layer 26 has a resistance as small as possible, because electroplating current is supplied to it. It is a tungsten layer 26 deposited by the sputtering method and having a thickness of 100 nm. When made of tungsten, it has a thickness preferably ranging from 50 nm to 300 nm. When its thickness becomes larger than 300 nm, it becomes difficult to remove it and when smaller than 50 nm, its resistance becomes too large. Molybdenum, aluminum, TiW, Pt or Pd may be used to form it. When it is formed not by tungsten but by one of these metals, its thickness ranges preferably from 30 nm to 300 nm.

As shown in FIG. 8, a resist layer 27 having a predetermined pattern is formed by the photo lithography technique. Openings 29 are formed in the resist layer 27. The second wiring 25 and 25a coated by the under metal layer 26 is present in the bottom of each opening 29. Each opening 29 has a width $W_2$ smaller than that $W_1$ of the second wiring 25, 25a, 25b and 25c, respectively. For example, the width $W_1$ is 1.0 μm greater than the width $W_2$. The second wiring 25, 25a, 25b and 25c remains covered with the under metal layer 26 even after that portion of the layer 26 which is deposited on the bottom of the opening 29 has been removed.

The under metal layer 26 exposed in the openings 29 is removed by the RIE (reactive ion etching) or vapor-phase etching method. As the result, the top layer Au of the second wiring 25 and 25a are thus exposed in the openings 29. When the under metal layer 26 is formed by aluminum, it is removed by the liquid-phase etching method by which mixed acid is used.

The electroplating process will be described referring to FIGS. 9 and 12 through 14.

The electroplating method is intended to deposit a plating wiring 28 on the second initial wiring 25 and 25a to reduce the resistance of the second final wirings (25, 25a, 28). For this purpose, the plating wiring 28 is made thicker than the second initial wiring 25a. For example, the thickness of the plating wiring 28 is set 1 μm when that of the second initial wiring 25a 2 μm.

A conductive needle 8 is stuck not into the opening 29 but into the resist layer 27 to contact the under metal layer 26 at the tip thereof, as shown in FIG. 9. The wafer is then immersed in plating solution, DC current or DC pulse current is caused to flow to the pattern circuit through the needle 8 and an Au-plated layer 28 is thus deposited only on the second wiring 25 and 25a which are exposed in the openings 29. The needle 8 is coated with an insulating layer 8a except its tip portion. This prevents Au deposited from adhering to the exposed portion of the needle 8.

Figure 12:
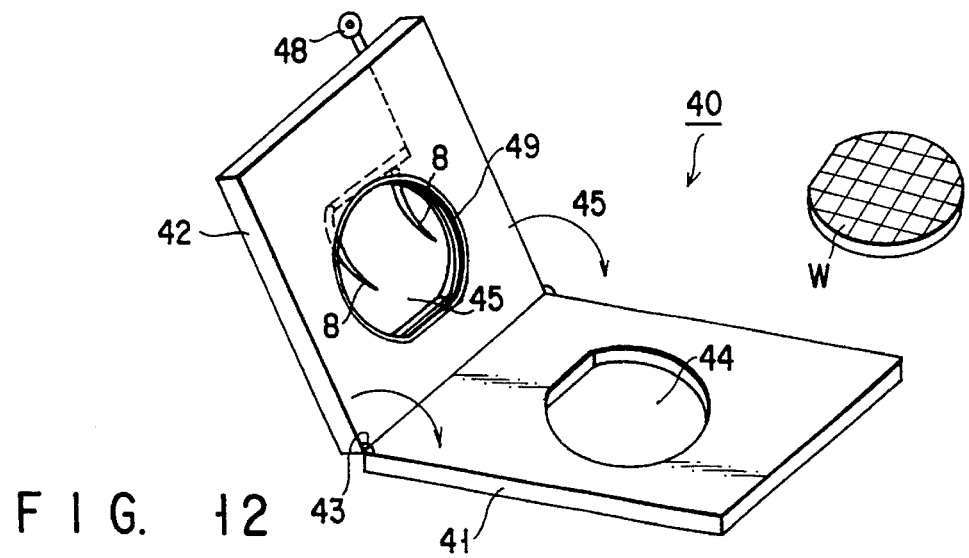
FIG. 12 is a perspective view showing a wafer holder used by the electroplating.
Figure 13:
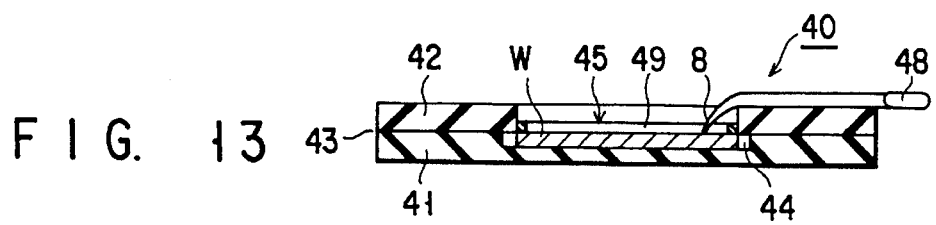
FIG. 13 is a vertically-sectioned view showing the wafer holder.

As shown in FIG. 12, a holder 40 comprises two plates 41 and 42 which can be opened and closed by hinges 43. A recess 44 is formed in the inner face of the plate 41 at the center thereof and a wafer W is fitted in the recess 44. An opening 45 is formed in the other plate 42 at the center thereof. The size of the opening 45 is equal or smaller than the diameter of a wafer. It is desirable that packing 49 be provide around the opening 45, so as to prevent a solution from flowing toward the reverse side of the wafer. The packing 49 is formed of a material which in not corroded or adversely affected by a plating solution; it is formed of silicone rubber, for example. Two needles 8 are attached to the outer face of the plate 42 and tips of these needles 8 are projected a little inside the plate 42 through the opening 45. Each needle 8 is made of tungsten.

When the wafer W is fitted into the recess 44 and the plate 41 is closed onto the plate 42, tips of the needles 8 are stuck into the resist layer 27 at the rim portion of the wafer W. Those points of the resist layer 27 on the wafer W into which the needles 8 are stuck are determined not to add any influence to the circuit pattern. The depth of the recess 44 is made smaller than the thickness of the wafer W. The top of the wafer W, therefore, is not at same level as the inner face of the plate 41, thereby allowing the needles 8 to more easily contact the wafer W.

Figure 14:
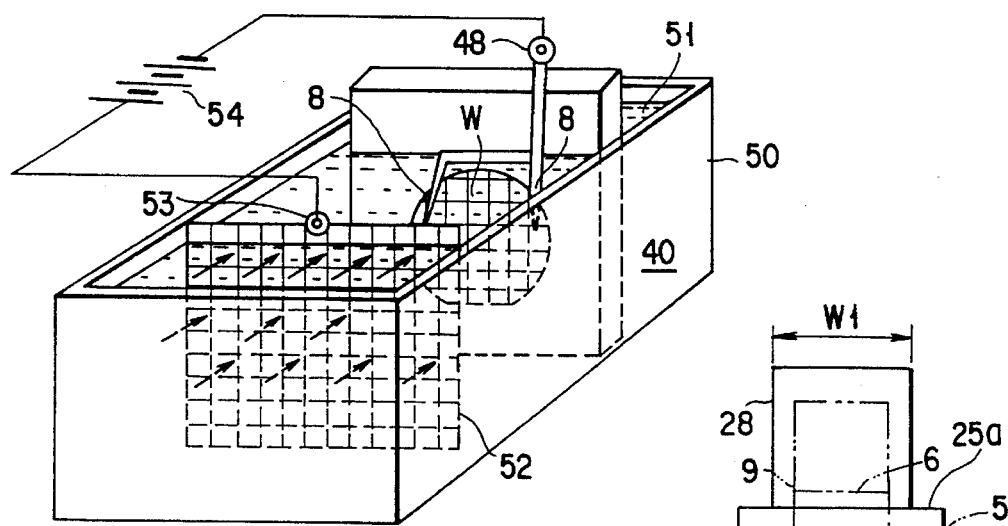
FIG. 14 is a perspective view showing an electroplating apparatus.

As shown in FIG. 14, the holder 40 in which the wafer W is held is immersed together with its opposed electrode 52 in a plating solution 51 in a plating bath (vessel) 50. A terminal 48 of the needles 8 is connected to a minus pole side of a DC power source 54 and a terminal 53 of the opposed electrode is further connected to a plus pole side of the DC power source 54. Plating conditions are as follows:

Plating solution: Gilding solution of non-cyanogen group (Main Components: Sodium gold sulfite)
Temperature: Room temperature –65° C.
Current density: 0.4–0.7 A/dm$^2$ The best current density is 0.56 A/dm$^2$. A laminar flow was generated, flowing from the electrode 52 to wafer W, to stir the plating solution 51 during the electroplating process. When the electroplating was carried out under the above conditions, it took about 370 seconds to make the plated layer 28 of 2.6 μm thick.

As shown in FIG. 10, the mask 27 is all removed by a resist remover. As the result, only Au-plated and basic tungsten layers 28 and 26 are exposed on the surface of the wafer W.

As shown in FIG. 11, all over the wafer W is etched by the $CF_4/O_2$-mixed gas-used RIE method to selectively remove only the tungsten layer 26. As the result, the second insulating layer 4 and the second wirings 25, 25a and 25b are exposed on the surface of the wafer W. To add more, the under metal layer 26 is removed by the liquid-phase etching method when it is formed by aluminum.

Figure 15:
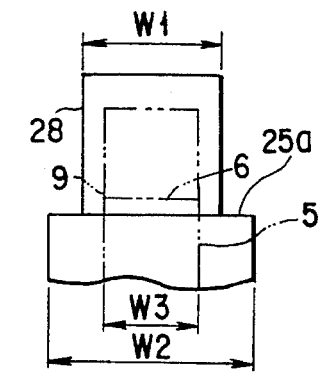
FIG. 15 is a vertically-sectioned view intended to compare a wiring according to the present invention with the conventional one.

As shown in FIG. 15, the wirings (25a, 28) in the above-described embodiment have a sectional area larger but a resistance smaller than the conventional ones (5, 6, 9). When the initial wiring 25a (or 5) of width $W_2$ was made 3 μm wide and 1 μm high and the plated wiring 28 (or 9) of width $W_1$ was made 2 μm wide and 2 μm high, for example, the resistant value of each wiring (25a or 28) in the above-described embodiment was reduced smaller than or to about 80–88% of those of the conventional wirings (5, 6, 9) of width $W_3$.

According to the above-described embodiment, the additional plated Au wiring 28 was formed directly on the initial Au wiring 25a after the under metal layer 26 was removed. Therefore, a thick film wiring having a closer contact between wirings 25a and 28, a more smooth surface and a higher pattern accuracy could be formed.

Further, the electroplating process and under metal removing process in the above-described embodiment uses not the plating solution of the cyanogen group but that of the non-cyanogen group. No harmful waste solution is thus caused and this is more preferable for reasons of safety and sanitation.

The present invention is not limited to the above-described embodiment but Mo or Al may also be used as the under metal. Cu, Ag, Pt or Pd may also be used as the plating metal.

Further, the present invention may also be applied to an Si or alumina substrate. The GaAs substrate itself is weak against acid and this enables secondary effects to be added to the present invention. Needless to say, however, the present invention can also be applied to the Si or alumina substrate.

According to the present invention, a plated metal layer having a smoother surface and a closer contact can be added to the initial wiring. In addition, the wiring can be held initial at the under metal removing process and the pattern can be formed with a higher accuracy and a better reproducibility. Further, the MMIC can be made without using any high cost ion milling apparatus and also without using any harmful composition of the cyanogen group.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for forming wirings of an integrated circuit, comprising:

a step of forming wirings on a substrate;

a step of coating the wirings with an under metal layer;

a step of coating the under metal layer with a mask except a part of the under metal layer;

a first etching step of removing the under metal layer which is not coated by the mask to expose upper portions of at least one of the wirings;

an electroplating step of depositing a plating metal layer on the exposed upper portions;

a step of removing the mask; and a second etching step of removing all of the remaining under metal layer;

wherein said plating metal layer is formed of substantially the same material as that of the exposed upper portions or by a material which can be physically contacted with the exposed upper portions and, wherein said electroplating step comprises contacting a needle with the mask-coated under metal layer, and supplying DC current to the exposed upper portions in a plating solution through the needles and the under metal layer, thereby permitting a plating metal layer to be deposited on the exposed upper portion.

2. The method according to claim 1, wherein each exposed upper portion includes at least one or more metals selected from the group of Au, Pt and Pd and deposited not by the plating method but by one of other methods, and said plating metal layer includes at least one or more metals selected from the group of Au, Pt and Pd.

3. The method according to claim 1, wherein each exposed upper portion is formed by Au deposited not by the plating method but by one of other methods, and said plating metal layer is formed by Au.

4. The method according to claim 1, wherein said under metal layer includes at least one or more metals selected from the group of W, Mo and Al.

5. The method according to claim 1, wherein the substrate is formed of semi-insulating GaAs.

6. The method according to claim 1, wherein said substrate is formed of semi-insulating GaAs, said exposed upper portions are formed by Au deposited not by the plating method but by one of other methods, said under metal layer includes at least one or more metals selected from the group of W, Mo and Al, and said plating metal layer is formed by Au.

7. The forming method according to claim 1, wherein said under metal layer is removed at the first and second etching processes by a reactive ion etching method.

8. The method according to claim 1, wherein said under metal layer is removed at the first etching process by $CF_4$ gas or $CF_4/O_2$ mixed gas using reactive ion etching method and it is removed at the second etching process by $CF_4$ gas or $CF_4/O_2$ mixed gas using reactive ion etching method.

9. The method according to claim 1, wherein said under metal layer is formed of tungsten having a thickness of 50–300 nm.

10. The method according to claim 1, wherein said under metal layer has a thickness of 50 to 300 nm and is made of a metal selected from the group consisting of Mo, Al, TiW, Pt and Pd.

11. A method for forming wirings of an integrated circuit, comprising:

a step of forming wirings on a substrate;

a step of coating the wirings with an under metal layer formed of tungsten having a thickness of 50–300 nm;

a step of coating the under metal layer with a mask except a part of the under metal layer;

a first etching step of removing the under metal layer which is not coated by the mask to expose upper portions of at least one of the wirings;

an electroplating step of depositing a plating metal layer on the exposed upper portions;

a step of removing the mask; and a second etching step of removing all of the remaining under metal layer;

wherein said plating metal layer is formed of substantially the same material as that of the exposed upper portions or by a material which can be physically contacted with the exposed upper portions.

12. The method according to claim 11, wherein said electroplating step comprises contacting a needle with the mask-coated under metal layer, and supplying DC current to the exposed upper portions in a plating solution through the needles and the under metal layer, thereby permitting a plating metal layer to be deposited on the exposed upper portion.

13. The method according to claim 11, wherein each exposed upper portion includes at least one or more metals selected from the group of Au, Pt and Pd and deposited not by the plating method but by one of other methods, and said plating metal layer includes at least one or more metals selected from the group of Au, Pt and Pd.

14. The method according to claim 11, wherein each exposed upper portion is formed by Au deposited not by the plating method but by one of other methods, and said plating metal layer is formed by Au.

15. The method according to claim 11, wherein the substrate is formed of semi-insulating GaAs.

16. The method according to claim 11, wherein said substrate is formed of semi-insulating GaAs, said exposed upper portions are formed by Au deposited not by the plating method but by one of other methods, and said plating metal layer is formed by Au.

17. The forming method according to claim 11, wherein said under metal layer is removed at the first and second etching processes by a reactive ion etching method.

18. The method according to claim 11, wherein said under metal layer is removed at the first etching process by $CF_4$ gas or $CF_4/O_2$ mixed gas using reactive ion etching method and it is removed at the second etching process by $CF_4$ gas or $CF_4/O_2$ mixed gas using reactive ion etching method.

* * * * *